United States Patent [19]

Clark

[11] Patent Number: 5,787,135
[45] Date of Patent: Jul. 28, 1998

[54] VARIABLE FREQUENCY DIVIDER

[75] Inventor: Iain Clark, Newark, Calif.

[73] Assignee: LSI Logic Corporation, Milpitas, Calif.

[21] Appl. No.: 889,374

[22] Filed: Jul. 8, 1997

Related U.S. Application Data

[62] Division of Ser. No. 334,747, Nov. 4, 1994, Pat. No. 5,692,023.

[51] Int. Cl.$^6$ .................................................. H03D 3/24
[52] U.S. Cl. .................. 375/376; 375/373; 375/375; 331/51; 377/108; 377/50
[58] Field of Search ........................ 375/371, 373, 375/375, 376; 331/1 A, 46, 48, 51, 55; 377/47, 50, 108

[56] References Cited

U.S. PATENT DOCUMENTS

| | | |
|---|---|---|
| 4,204,173 | 5/1980 | Aschwanden .................. 331/1 A |
| 4,403,342 | 9/1983 | Borras et al. ................... 455/76 |
| 4,464,771 | 8/1984 | Sorensen . |
| 4,559,505 | 12/1985 | Suarez et al. . |
| 4,562,410 | 12/1985 | O'Rourke . |
| 4,649,353 | 3/1987 | Sonnenberg . |
| 4,736,167 | 4/1988 | Kojima et al. . |
| 4,746,870 | 5/1988 | Underhill . |
| 4,857,866 | 8/1989 | Tateishi . |
| 4,935,707 | 6/1990 | Irwin . |
| 4,952,889 | 8/1990 | Irwin et al. . |
| 5,166,644 | 11/1992 | Saito et al. . |
| 5,180,993 | 1/1993 | Dent . |
| 5,221,911 | 6/1993 | Kasperkovitz et al. . |
| 5,254,955 | 10/1993 | Saeki et al. . |
| 5,692,023 | 11/1997 | Clark . |

*Primary Examiner*—Wellington Chin
*Assistant Examiner*—Conguan Tran
*Attorney, Agent, or Firm*—Oppenheimer Wolff & Donnelly LLP

[57] ABSTRACT

A phase locked loop includes a voltage controlled oscillator (VCO) for generating output VCO pulses. A frequency divider divides the VCO pulses by a variable number to produce frequency divided pulses whose phase is compared with that of input reference pulses by a phase detector. An update pulse is produced by the phase comparator having a pulsewidth corresponding to the detected phase difference. A pulse generator generates a train of update pulses having a combined pulsewidth equal to the pulsewidth of the update pulse, with the update pulses being substantially equally distributed within each period of the reference pulses to produce low output ripple. The update pulses are integrated by a loop filter to produce a D.C. control voltage that controls the VCO to vary the frequency of the VCO pulses such that the phase difference is adjusted toward zero. The frequency divider comprises a binary counter and a controller that enable the frequency divider to divide by a number N that is not a power of 2. The controller controls the counter to count to a number P which is the largest power of 2 smaller than N, and prevents the counter from counting R=N-P pulses that are substantially evenly distributed within a period of the reference pulses such that the frequency of the VCO pulses is divided by N.

11 Claims, 8 Drawing Sheets

PRIOR ART

VARIABLE FREQUENCY DIVIDER

CROSS-REFERENCE TO RELATED APPLICATION

This is a divisional of application Ser. No. 08/334,747, filed Nov. 4, 1994 now U.S. Pat. No. 5,692,023.

BACKGROUND OF THE INVENTION

1. Field of the Invention

The present invention generally relates to the art of electronic circuits, and more specifically to a phase locked loop circuit including distributed phase correction pulses for reducing output ripple.

2. Description of the Related Art

A phase locked loop (PLL) is a closed-loop feedback system in which the phase of a periodic output is made to follow, under steady-state conditions, the phase of a periodic input signal. PLLs have many applications in communications, control systems and instrumentation systems. They can be used to modulate and demodulate narrow-band FM signals, demodulate AM signals, synthesize frequencies in digital communications equipment, control motor speed, etc.

Figures 1, 2, 6:
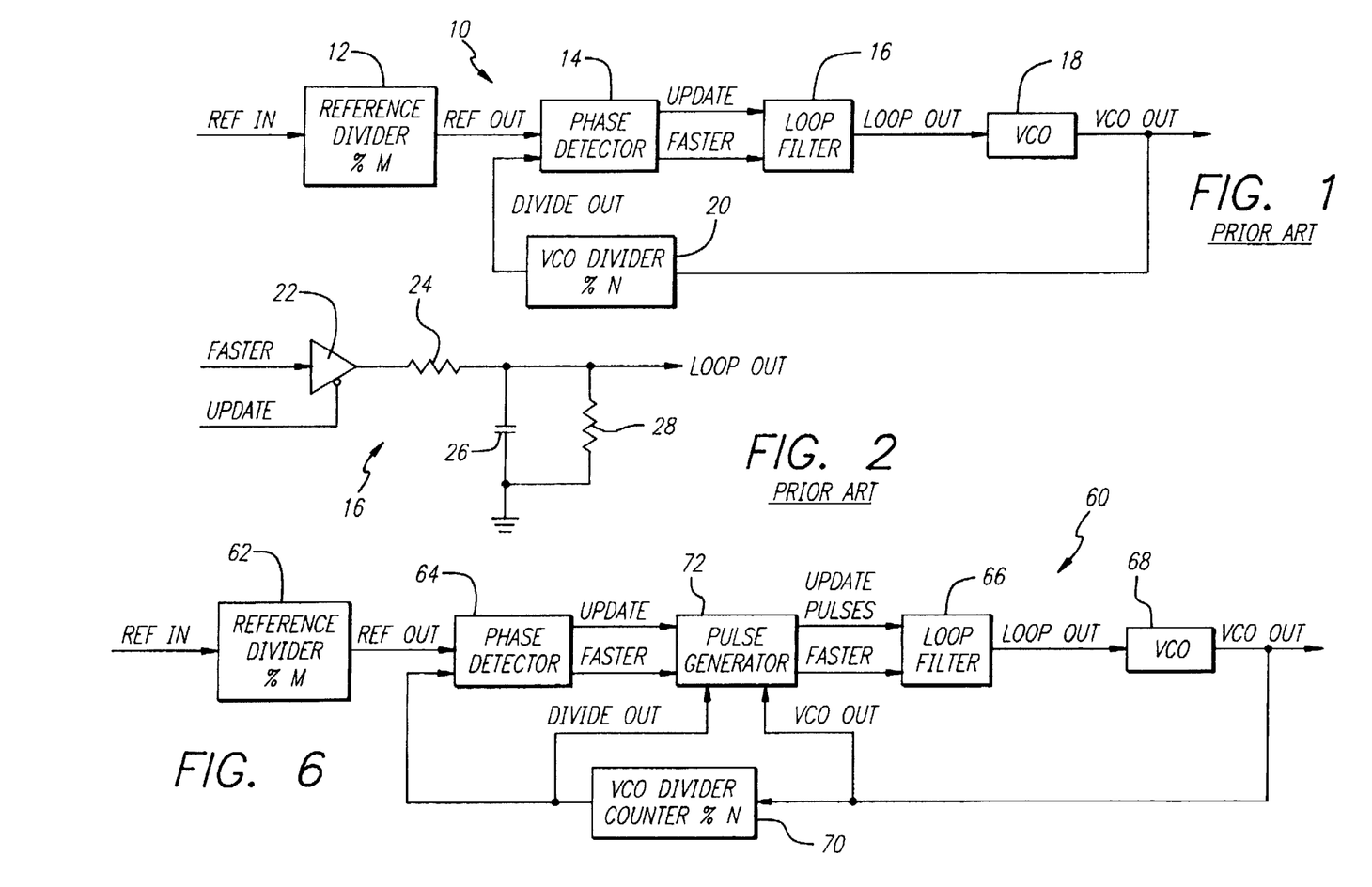
FIG. 1 is a block diagram illustrating a conventional phase locked loop (PLL) circuit.
FIG. 2 is an electrical schematic diagram illustrating a loop filter of the PLL of FIG. 1.
FIG. 6 is a block diagram illustrating a PLL circuit embodying the present invention.

A conventional PLL circuit 10 that is configured to operate as a frequency synthesizer is illustrated in FIG. 1. The circuit 10 comprises a reference frequency divider 12 that divides the frequency of a periodic (sinusoidal or pulse) input signal REF IN by a ratio or number M. The divider 12 produces output pulses REF OUT at a frequency that is 1/M that of the signal REF IN.

The signals REF OUT are applied to an input of a phase detector 14 that compares the phase of the signals REF OUT with that of DIVIDE OUT signals and produces an update pulse or signal UPDATE having a pulsewidth corresponding to the detected phase difference. The signal UPDATE is integrated by a loop filter 16 to produce a D.C. control signal LOOP OUT that is applied to a voltage controlled oscillator (VCO) 18.

The VCO 18 generates an output signal VCO OUT consisting of pulses at a frequency corresponding to the magnitude of the signal LOOP OUT. The VCO OUT pulses are applied to a VCO divider 20 that divides the frequency of the pulses VCO OUT to produce the DIVIDE OUT pulses at a frequency that is 1/N that of the VCO OUT pulses.

The operation of the circuit 10 is such that, under steady state conditions, the frequencies of the inputs to the phase detector 14, constituted by the signals REF OUT and DIVIDE OUT, are equal. In order for this to occur, the VCO 18 must generate the VCO OUT pulses at a frequency that is N times that of the DIVIDE OUT pulses to compensate for the frequency division performed by the divider 20. Thus, the circuit 10 multiplies the frequency of the REF OUT pulses by the ratio or number N.

Since the divider 12 divides the frequency of the input signal REF IN by M, the frequency of the output pulses VCO OUT is N/M times the frequency of the input pulses REF IN. The frequency of the output pulses VCO OUT can be varied by changing the frequency division ratios N and M.

In a frequency synthesizer application, it is desired to vary the frequency of the VCO OUT pulses in relatively small increments. A particular VCO OUT frequency is generated by selecting values of M and N such that their quotient, multiplied by the REF IN frequency, is closest to the desired frequency.

Increasing the number of available values of M and N increases the ability to synthesize frequencies that are closer to the desired frequencies. Increasing the magnitudes of the largest values of M and N decreases the granularity of frequency synthesization or, in other words, the minimum increment size or frequency step size.

The loop filter 16 is illustrated in more detail in FIG. 2. The UPDATE signal is applied to the control input of a tri-state buffer 22. The phase detector 14 also generates a signal FASTER that indicates whether the frequency of the DIVIDE OUT pulses is higher (leading phase) or lower (lagging phase) relative to the REF OUT pulses. If the DIVIDE OUT pulses are lower in frequency than the REF OUT pulses, the FASTER signal is logically high, indicating that the frequency of the REF OUT pulses should be increased, and vice-versa.

If the FASTER signal is high, the tri-state buffer 22 feeds a high signal through a resistor 24 to an integrating capacitor 26 during the pulsewidth or period of the UPDATE signal. This adds charge to the capacitor 26 which causes the voltage across the capacitor 26, which constitutes the LOOP OUT signal, to increase. This causes the VCO 18 to increase the frequency of the VCO OUT pulses and thereby adjust the phase difference between the DIVIDE OUT pulses and the REF OUT pulses toward zero.

If the FASTER signal is logically low, the tri-state buffer 22 produces a low signal during the period of the UPDATE signal that removes charge from the capacitor 26, reduces the voltage of the LOOP OUT signal and causes the frequency of the VCO OUT pulses to decrease.

A problem which has persisted in the conventional PLL circuit 10 is ripple in the LOOP OUT signal that causes output jitter in the output pulses VCO OUT. This ripple is caused by leakage current in the loop filter 16. As illustrated in FIG. 2, a leakage path to ground or power, which cannot be eliminated in an actual circuit, is symbolically represented by a resistance 28.

In the locked condition the frequency of VCO OUT varies above and below its average value as the VCO control voltage varies above and below its average value as it is updated and then discharged (or charged) by the leakage current. Consequently, the phase of the pulses VCO OUT must be slightly increased such that the frequency of the pulses DIVIDE OUT is sufficiently higher than that of the pulses REF OUT that the UPDATE signal will charge the capacitor 26 to a value that is equal and opposite to the leakage current.

The obvious solution to this problem is to increase the value of the capacitor 26. However, this is impractical in many applications due to limited output drive and the fact that large capacitors occupy inordinate amounts of space on integrated circuit chips.

Figure 3A:
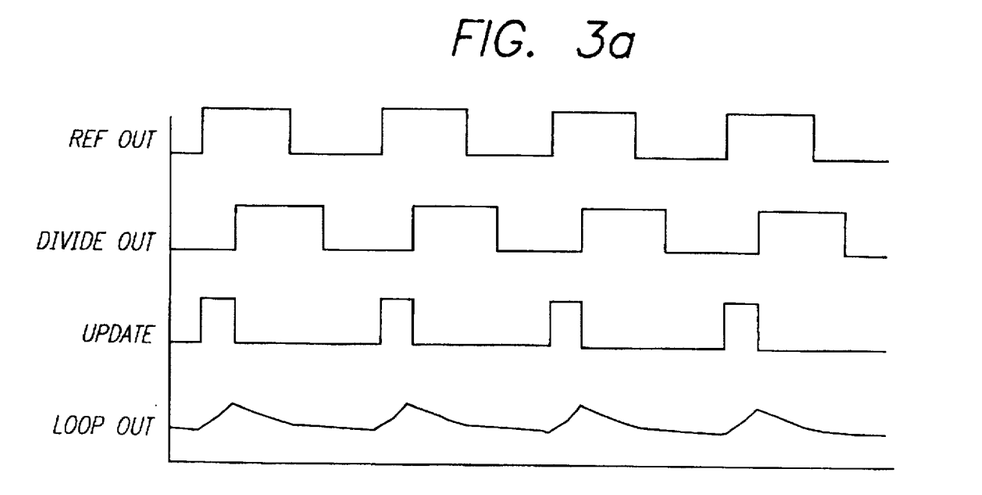
FIGS. 3a and 3b are timing diagrams illustrating a drawback of the conventional PLL circuit.

The problem is exacerbated in applications in which the frequency division ratios M and N are made high in order to generate the VCO OUT signal at smaller frequency increments. As illustrated in FIG. 3a, the UPDATE signal is produced between the leading edges of corresponding REF OUT and DIVIDE OUT pulses. Assuming that the FASTER signal is high, the capacitor 26 charges during the UPDATE signal period and discharges when the UPDATE signal is not present. If the FASTER signal is low, the capacitor 26 also discharges during the period of the UPDATE signal.

In this manner, the LOOP OUT signal has an A.C. ripple component that is produced by the charging and discharging of the capacitor 26. This ripple causes undesirable phase jitter in the output pulses VCO OUT.

Figure 3B:
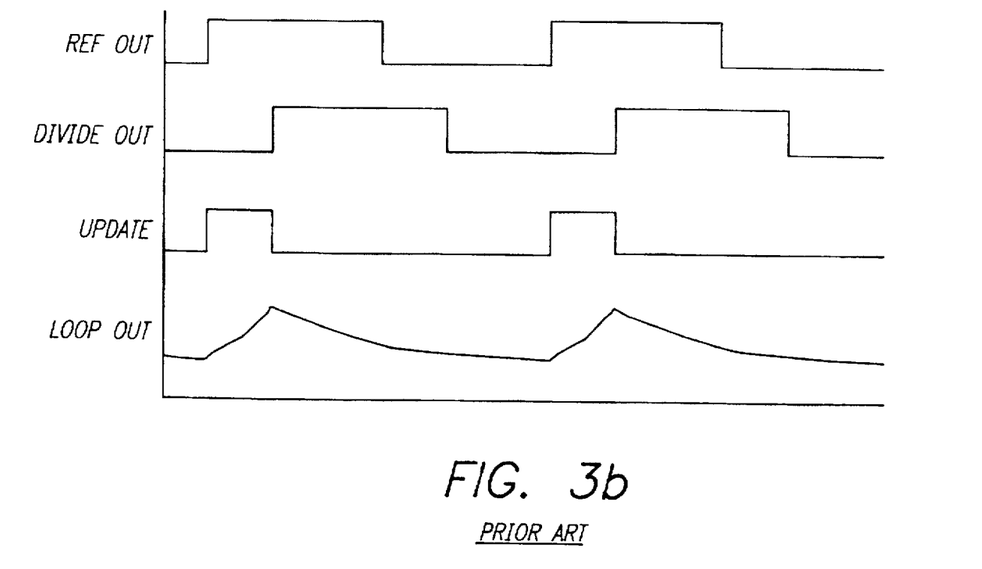

The amplitude of the ripple increases as the frequency division ratios or numbers M and N are increased and the frequencies of the REF OUT and DIVIDE OUT pulses are correspondingly decreased. FIG. 3b illustrates a case in which the ratios N and M are twice as high as in the example of FIG. 3a. Assuming the same phase difference, the period of the UPDATE signal in FIG. 3b is twice that of FIG. 3a, causing the capacitor 26 to charge for twice as long. This causes the amplitude of the ripple in the LOOP OUT signal to double, and thereby increase the frequency deviation.

In a practical frequency synthesizer for digital communications equipment having small frequency increments, the frequency dividers 12 and 20 must be capable of selectively producing a large number of high and closely spaced division ratios N and M. The reference to complicated and expensive circuitry was made that which would have been required to apply the fundamental algorithm to a PLL using conventional counters and a "Binary Division" circuit capable of operating on any two arbitrary binary values of a given number of bits.

Figure 4:
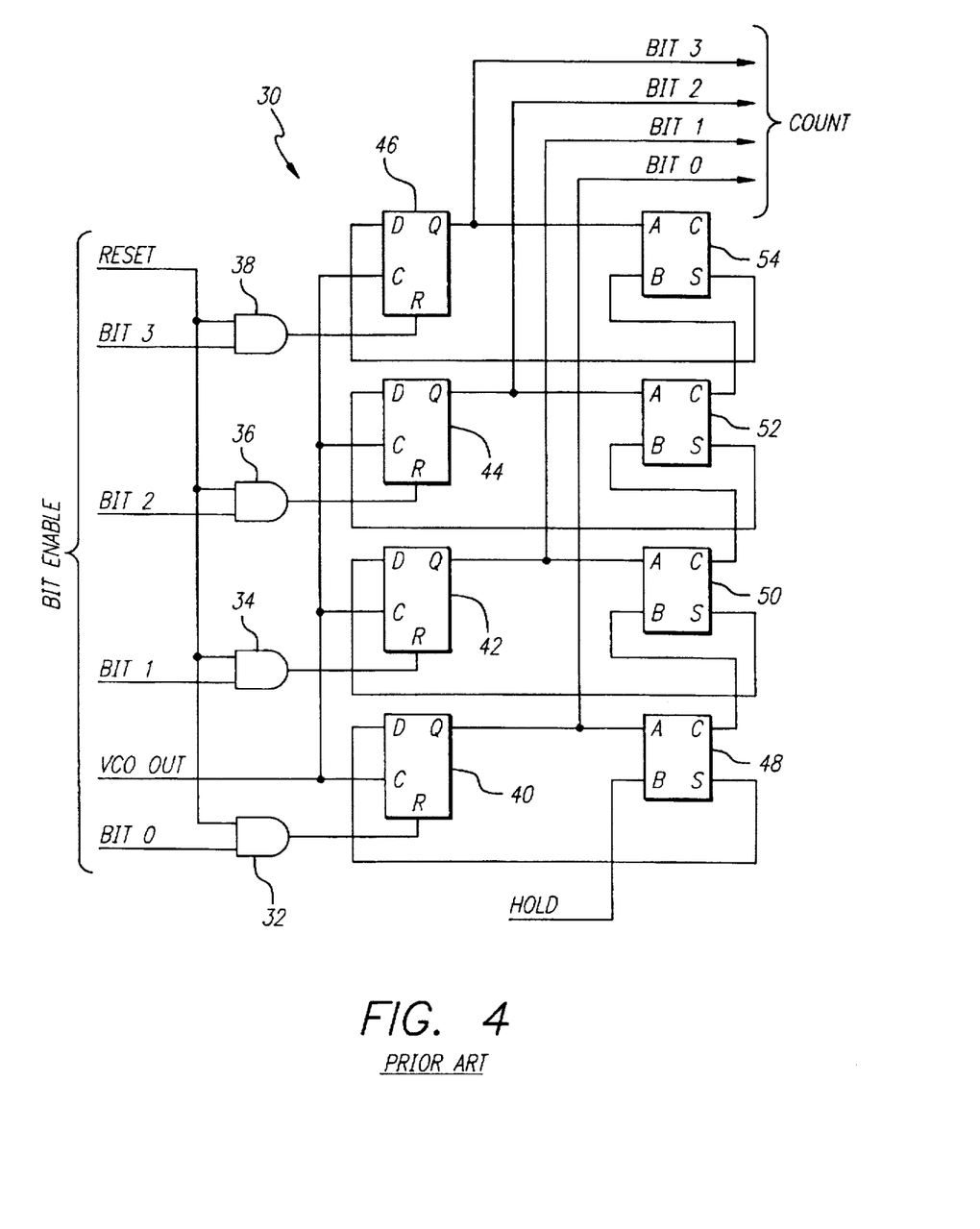
FIG. 4 is an electrical schematic diagram illustrating a conventional binary counter.

A conventional binary counter 30 that can be used as the VCO divider 20 is illustrated in FIG. 4. The counter 30, although simple and inexpensive to implement on an integrated circuit chip, is limited in that it is only able to count or frequency divide in powers of 2. It is therefore unsuitable, in its conventional form, for narrow increment frequency synthesis. However, as will be described below, the counter 30 can be controlled in accordance with the present invention to count to and provide any frequency division ratio up to its maximum capacity.

The counter 30 receives a four bit binary BIT ENABLE signal, the individual bits of which are applied to inputs of AND gates 32, 34, 36 and 38. The individual bits of the BIT ENABLE signal, as well as other binary entities, are designated in this specification by the power of 2 that they represent. For example, a four bit binary number 1001 consists of a bit 0 ($2^0$)=1, a bit 1 ($2^1$)=0, a bit 2 ($2^2$)=0 and a bit 3 ($2^3$)=1. A RESET signal is applied to the other inputs of the AND gates 32, 34, 36 and 38.

The outputs of the AND gates 32, 34, 36 and 38 are applied to reset inputs R of D-type flip-flops 40, 42, 44 and 46, outputs Q of which are applied to A inputs of half-adders 48, 50, 52 and 54 respectively. Sum outputs S of the half-adders 48, 50, 52 and 54 are connected to inputs D of the flip-flops 40, 42, 44 and 48, whereas carry outputs C of the half-adders 48, 50 and 52 are connected to B inputs of the half-adders 50, 52 and 54 respectively. A HOLD signal is applied to the B input of the flip-flop 48.

The counter 30 can be operated as a frequency divider by applying VCO OUT pulses to clock inputs C of the flip-flops 40, 42, 44 and 46. When the counter 30 has counted to its maximum count (the frequency division ratio N), bit 0 to 3 outputs, which appear at the Q outputs of the flip-flops 40, 42, 44 and 46 respectively, will all go high. This event can be detected to produce an output pulse DIVIDE OUT. In this manner, one DIVIDE OUT pulse will be produced for each N VCO OUT pulses.

The counter 30 is initially cleared by applying the RESET signal to the AND gates 32, 34, 36 and 38 and applying a VCO OUT pulse to the flip-flops 40, 42, 44 and 46. This resets the flip-flops 40, 42, 44 and 46 such that their Q outputs all go low. Then, the bits corresponding to the desired frequency division number or ratio N are enabled by applying high BIT ENABLE signals to the corresponding AND gates 32, 34, 36 and 38.

The maximum ratio N=16 is provided by enabling all of the bits 0 to 3 of the counter 30. A ratio N=4 is provided by enabling only the bits 0 and 1, etc. It will be understood that although the counter 30 is illustrated as comprising only four bits, this is merely for describing the operation thereof in a simplified manner, and that the counter 30 can comprise any desired number of bits. For example, a 16 bit counter can provide a maximum frequency division ratio of N=65,536.

The sum output S of each half-adder 48, 50, 52 and 54 is the exclusive OR function of the inputs A and B, such that the output S will be high if the inputs A and B are different and low if the inputs A and B are the same. The carry output C is the AND function of the inputs A and B, and will be high only if both inputs A and B are high.

The current count of the counter 30 is produced at the outputs Q, whereas the next count is produced at the sum outputs S of the half-adders 48, 50, 52 and 54 and applied to the D inputs of the flip-flops 40, 42, 44 and 46 respectively. The HOLD signal is applied to the B input of the flip-flop 48. If the HOLD signal is high, the counter 30 counts up by one count in response to the next VCO OUT pulse. If the HOLD signal is low, the next count is the same as the current count, and the counter 30 does not change in response to the next VCO OUT pulse.

The half-adders 48, 50, 52 and 54 cause the carry outputs C to cascade up through the bits of the count. Assuming that the HOLD signal is high, if the Q output of the flip-flop 40 is low, the next VCO OUT pulse will cause the sum output S of the half-adder 48 to go high and the carry output C thereof to go low. The high sum output S of the half-adder 48 is applied to the D input of the flip-flop 40 such that the next VCO OUT pulse causes the Q output of the flip-flop 40 to go high. This causes the count of the counter 30 to increase by one, such that the least significant bit, bit 0, is changed from low to high.

Assuming that the Q output of the flip-flop 40 is high, the sum output S of the half-adder 48 will be low and the carry output C thereof will be high. The next VCO OUT pulse will cause the flip-flop 40 to produce a low Q output and cause the high carry output C of the half-adder 48 to increment the bit 1 stage (the flip-flop 42 and half-adder 50) of the counter 30. The operation is identical for all of the stages of the counter 30.

Key features of the counter 30 are the BIT ENABLE inputs that enable the counter 30 to count to selected powers of 2, and the HOLD signal input that controls the counter 30 to either count or not to count in response to VCO OUT pulses. As discussed above, however, application of the counter 30 per se in a conventional phase locked loop synthesizer is limited and undesirable since the frequency division ratios are limited to powers of 2.

SUMMARY OF THE INVENTION

It is an object of the present invention to reduce the ripple and accompanying phase jitter in a phase locked loop circuit.

This object is accomplished by a phase locked loop circuit including a voltage controlled oscillator (VCO) for generating output VCO pulses. A frequency divider divides the VCO pulses by a variable value to produce frequency divided pulses whose phase is compared with that of input reference pulses by a phase detector.

An update pulse is produced by the phase comparator having a pulsewidth corresponding to the detected phase difference. A pulse generator generates a train of update pulses having a combined pulsewidth equal to the pulsewidth of the update pulse, with the update pulses being substantially equally distributed within each period of the reference pulses to produce low output ripple.

The update pulses are integrated by a loop filter to produce a D.C. control voltage that controls the VCO to vary the frequency of the VCO pulses such that the phase difference is adjusted toward zero. The frequency divider comprises a binary counter and a controller that enable the frequency divider to divide by a number N that is not necessarily a power of 2.

The controller controls the counter to count to a number P which is the largest power of 2 smaller than N, and prevents the counter from counting R=N-P pulses that are substantially evenly distributed within a period of the reference pulses such that the frequency of the VCO pulses is divided by N.

It is another object of the present invention to provide a simplified frequency divider comprising a binary counter that is capable of providing frequency division ratios that are not powers of 2.

This object is accomplished by a variable frequency divider that includes a binary counter for counting pulses, and a controller for controlling the counter to produce an output pulse after a number N of pulses has been applied to the counter such that the frequency of said pulses is divided by the number N.

If the number N is not a power of 2, the controller controls the counter to count to a number P that is the largest power of 2 smaller than N, and further prevents the counter from counting a number R=N-P of pulses which are substantially evenly distributed among the number P of pulses that are counted by the counter.

The present invention further comprises a method of generating a phase correction signal in a phase locked loop, including the steps of measuring a phase delay period between VCO pulses and reference pulses, and generating the phase correction signal as including a plurality of update pulses having a combined period that is substantially equal to the phase delay period, with the update pulses being substantially equally distributed within a period of said reference signal.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 5:
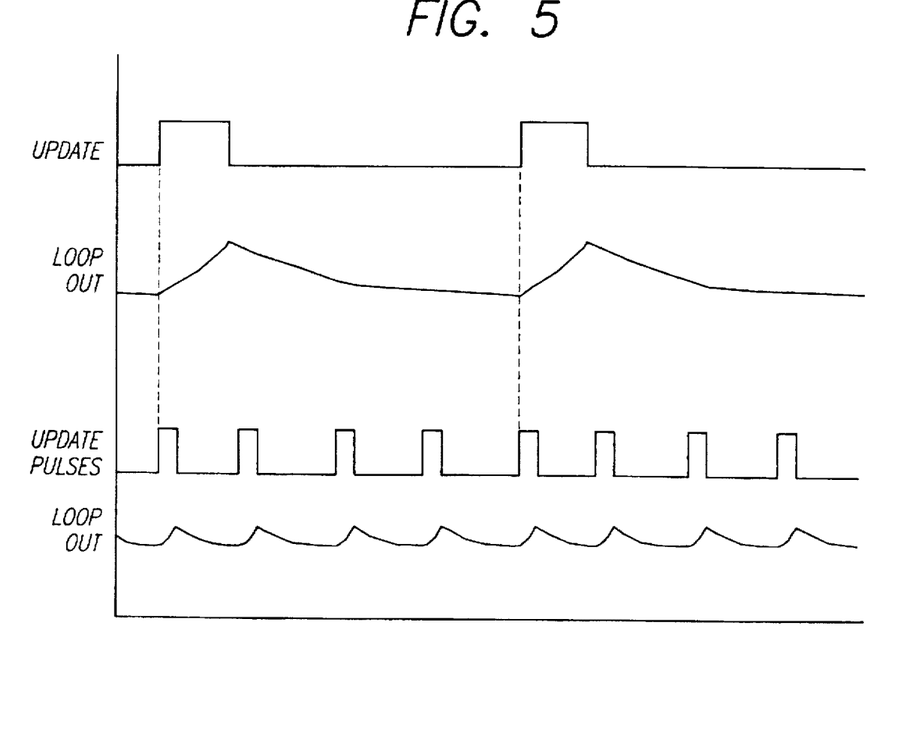
FIG. 5 is a timing diagram illustrating a principle of the present invention.

A conventional phase locked loop (PLL) circuit was described above with reference to FIG. 1. FIG. 5 illustrates how the goal of reducing ripple in the control signal LOOP OUT of the loop filter of a PLL and the accompanying phase jitter in the output signal VCO OUT is reduced in accordance with the present invention.

The upper curve in FIG. 5 illustrates two consecutive UPDATE signals, whereas the second curve illustrates the LOOP OUT signal that would be produced by the loop filter of the PLL in response to the UPDATE signals. It will be noted that the LOOP OUT signal has a large amplitude A.C. ripple component as described above with reference to FIGS. 3a and 3b.

The present invention reduces the ripple component by, rather than applying the UPDATE signal directly to the loop filter in the conventional manner, measuring the pulsewidth of the UPDATE signal and applying a train of UPDATE PULSES to the loop filter as illustrated by the third curve in FIG. 5.

More specifically, the combined pulsewidth of the UPDATE PULSES is equal to the pulsewidth of the UPDATE signal. However, the UPDATE PULSES are substantially uniformly distributed within each period of the REF OUT (or equivalently the DIVIDE OUT) pulses. The period of the REF OUT and DIVIDE OUT pulses is also substantially equivalent to the period of the UPDATE signals.

As illustrated by the lower curve of FIG. 5, the LOOP OUT signal which results from applying the UPDATE PULSES to the loop filter rather than the UPDATE signal has much lower amplitude ripple than the second curve of FIG. 5. This is because, since the UPDATE PULSES have smaller pulsewidths than the UPDATE signal and are distributed in time, the capacitor in the loop filter has less time to charge and discharge than in the conventional PLL circuit 10 of FIG. 1.

In the example of FIG. 5, the UPDATE signal has a pulsewidth equal to four VCO OUT periods, and each UPDATE PULSE has a period equal to one VCO OUT period. There are four UPDATE PULSES produced during each REF OUT pulse period. Thus, the time that the capacitor in the loop filter is charged by the UPDATE PULSES is the same as that provided by the UPDATE signal such that the frequency or phase correction is performed in the same manner as in the conventional PLL circuit 10.

However, the ripple in the LOOP OUT signal and the phase jitter in the VCO OUT signal are reduced substantially as illustrated by the lower curve of FIG. 5. The amplitude reduction of the ripple is equal to the number of UPDATE PULSES that are generated for each UPDATE signal. In the illustrated example, four UPDATE PULSES are generated, and the amplitude of the ripple is reduced by a factor of four.

A phase locked loop (PLL) circuit 60 embodying the present invention is illustrated in FIG. 6. The circuit 60 comprises a reference divider 62, a phase detector 64, a loop filter 66 and a voltage controlled oscillator (VCO) 68 that are essentially similar to the corresponding elements described above with reference to FIG. 1.

However, the present circuit 60 comprises, rather than a complicated and expensive frequency divider as described above with reference to prior art frequency synthesizers, a VCO divider counter 70 that is constituted by a simple binary counter that can be of the type described with reference to FIG. 4, although the invention is not so limited. The present circuit 60 further comprises a pulse generator 72 for generating and distributing the UPDATE PULSES as described with reference to FIG. 5.

The present invention exploits a unique relationship that was discovered by the Inventor regarding the bits in the binary frequency division ratio or number N which will be described using an example. As listed in TABLE 1 below, it will be assumed that the frequency division ratio or number is N=26 (binary 0001 1010), and that pulsewidth W of the UPDATE signal, expressed as a multiple of VCO OUT pulse periods, is W=decimal 11=(binary 1011).

TABLE 1

| VCO Pulse | Count (C) | CRMO | Select Bit (B) | Count Value | State Width | Update Value |
|---|---|---|---|---|---|---|
| 1 | 0000 | 0 | 3 | 1 | 2 | 1 |
| 2 | 0000 | | | | | 0 |
| 3 | 0001 | 1 | 2 | 0 | 1 | 0 |
| 4 | 0010 | 0 | 3 | 1 | 2 | 1 |
| 5 | 0010 | | | | | 0 |
| 6 | 0011 | 2 | 1 | 1 | 2 | 1 |
| 7 | 0011 | | | | | 0 |
| 8 | 0100 | 0 | 3 | 1 | 2 | 1 |
| 9 | 0100 | | | | | 0 |
| 10 | 0101 | 1 | 2 | 0 | 1 | 0 |
| 11 | 0110 | 0 | 3 | 1 | 2 | 1 |
| 12 | 0110 | | | | | 0 |
| 13 | 0111 | 3 | 0 | 0 | 1 | 1 |
| 14 | 1000 | 0 | 3 | 1 | 2 | 1 |
| 15 | 1000 | | | | | 0 |
| 16 | 1001 | 1 | 2 | 0 | 1 | 0 |
| 17 | 1010 | 0 | 3 | 1 | 2 | 1 |
| 18 | 1010 | | | | | 0 |
| 19 | 1011 | 2 | 1 | 1 | 2 | 1 |
| 20 | 1011 | | | | | 0 |
| 21 | 1100 | 0 | 3 | 1 | 2 | 1 |
| 22 | 1100 | | | | | 0 |
| 23 | 1101 | 1 | 2 | 0 | 1 | 0 |
| 24 | 1110 | 0 | 3 | 1 | 2 | 1 |
| 25 | 1110 | | | | | 0 |
| 26 | 1111 | 4 | MSB | 0 forced | 1 | 0 |

The highest power of 2 that is lower than the number N=26 is 16. This number is designated as P=16. The most significant or leftmost one bit LMO that is logically high in the number N=decimal 26=binary 0001 1010 is bit 4, corresponding to the ($2^4$) bit position using the notation presented above. Bit 4 has the value $2^4$=16, which is the same as P.

The present Inventor has discovered that the number N, in a non-trivial case in which N is not a power of 2, can be divided into two parts; the LMO, which has the numerical value P, and a remainder R, such that N=P+R. In the case of N=0001 1010, the LMO is bit 4 of N and has the value P=0001 0000=16, whereas the remainder R is 1010=decimal 10. It will be noted that the maximum number that can be counted using the remainder R is equal to the value P of the LMO.

This relationship is exploited in accordance with the present invention to enable a simple binary counter such as described with reference to FIG. 4 to count or divide by numbers that are not powers of 2. This is accomplished by making the HOLD signal high during P VCO OUT pulses such that the counter counts all of these P pulses, and making the HOLD signal low during R VCO OUT pulses such that the counter does not count these R pulses.

The divide number N=P+R. Although the counter only counts to 16, it does so in response to N=26 VCO OUT pulses. More specifically, the counter counts in response to P=16 VCO OUT pulses and does not count in response to R=10 VCO OUT pulses. Thus, the desired operation of utilizing a simple binary counter to count or frequency divide by numbers other than powers of 2 is achieved.

The manner in which the counter is controlled to provide the operation described above is achieved in accordance with another unique relationship that was discovered by the present Inventor. Referring again to TABLE 1, the count C of the counter in the VCO divider 70 is tabulated along with the number of applied VCO OUT pulses (total N=26).

Further listed is a CRMO, which is the number of contiguous least significant or rightmost logically high (1) bits in the count C, starting with the least significant bit 0. For example, the count corresponding to VCO OUT pulse 13 is C=0111, and the CRMO=3. The CRMO for VCO OUT pulse 8 and C=0100 is CRMO=0, whereas the CRMO for VCO OUT pulse 6 and C=0011 is CRMO=2.

TABLE 2

| CRMO | CRMO Occurrences | BIT Select | BIT Select Occurrences | R | Double States |
|---|---|---|---|---|---|
| 0 | 8 | 3 | 8 | 1 | 8 |
| 1 | 4 | 2 | 4 | 0 | 0 |
| 2 | 2 | 1 | 2 | 1 | 2 |
| 3 | 1 | 0 | 1 | 0 | 0 |
| 4 | 1 | −1 | 1 | | |

As listed in TABLE 2 above, the distribution of the CRMO values in the N VCO OUT pulses is unique. More specifically, CRMO=0 occurs 8 times, which is the value ($2^3$) of the most significant bit (bit 3) in the remainder R. CRMO=1 occurs 4 times, etc. The significance of this relationship is that the number of occurrences of each value of CRMO corresponds to a power of 2 as represented by a bit in the remainder R.

It will be recalled that the remainder R is the number of VCO OUT pulses that the counter must be prevented from counting in order for the present scheme to work. In the present example, the remainder R=1010, where the logically high bits have the values bit 3=8 and bit 1=2, for a total of 10.

The present invention accomplishes its goal in the illustrated example by generating a HOLD signal in response to each occurrence of CRMO=3 (8 occurrences) and each occurrence of CRMO=1 (2 occurrences) for a total of 10 occurrences. This is possible due to the direct correlation between the number of occurrences of each value of CRMO and the binary weight of each bit in the remainder R. The CRMO occurrences are converted into the bit select values B that select the corresponding bits of the remainder in order to generate the HOLD signals.

As will be described in detail below, the pulse generator 72 computes the bit select value B in accordance with the relation B=LMO-1-CRMO, where LMO-1 is the most significant bit of the remainder R. As illustrated in TABLE 2, the bit select value B has the numerical value of the bit of the remainder R that is to be correlated with the CRMO occurrences. In the present example, LMO=4 and LMO-1= 3. For the first VCO OUT pulse, the count C=0000, and the bit select value B=3-0=3. This causes bit 3 of the remainder R, which is high, to be selected. In this manner, the numbers of bit select occurrences are correlated to the numbers of CRMO occurrences and also to the binary weights of the bits of the remainder R.

Figure 7:
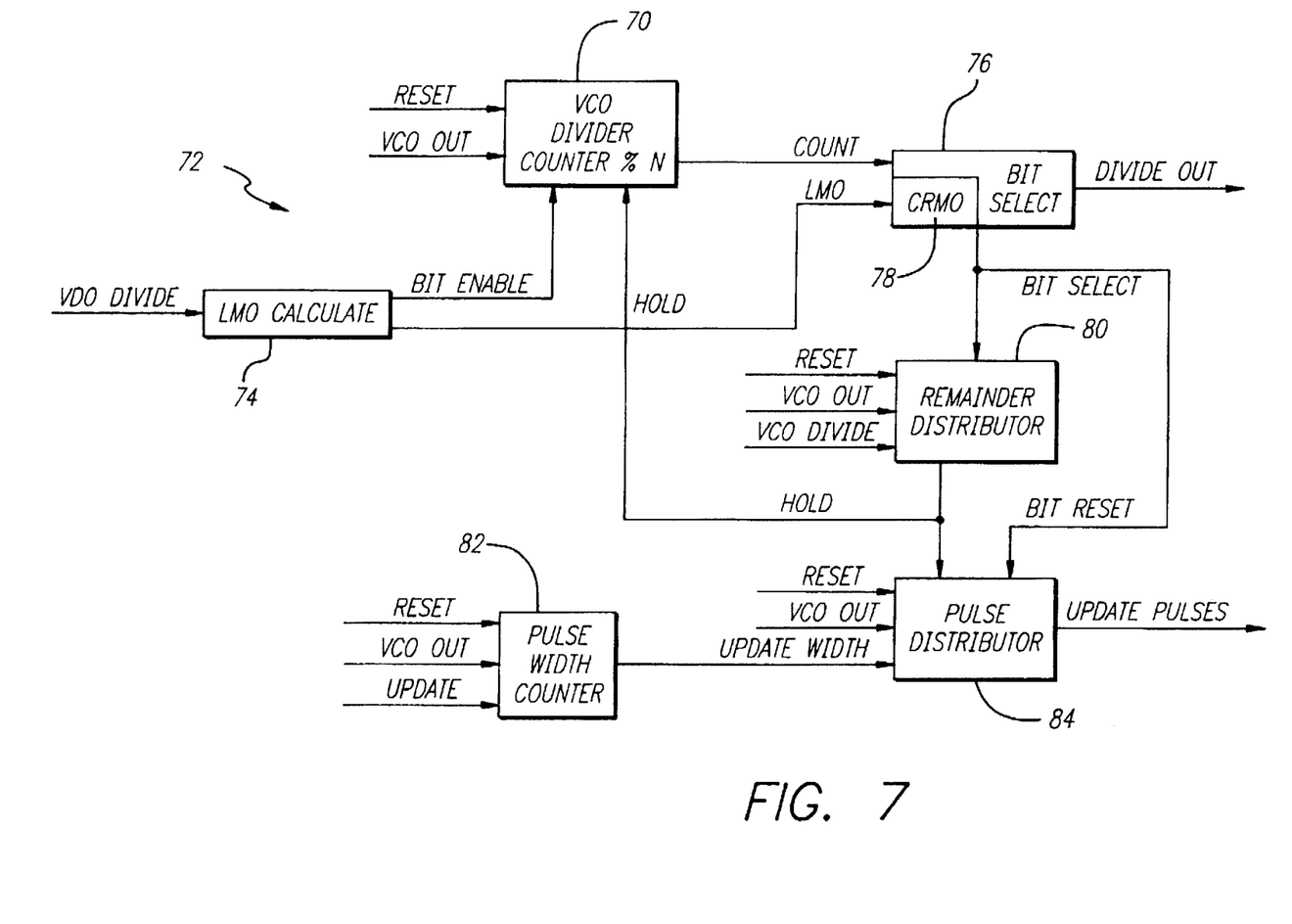
FIG. 7 is a block diagram illustrating a VCO divider and pulse generator of the PLL circuit of FIG. 6.

The VCO divider counter 70 and pulse generator 72 are illustrated in more detail in FIG. 7. It will be assumed for purposes of example that the counter 70 is constituted by a 16 bit counter of the type described with reference to FIG. 4, and receives the RESET signal and the HOLD signal which are each one bit signals. The counter 70 is capable of counting and thereby performing frequency division up to a maximum division ratio or number N=65,536.

The generator 72 comprises an LMO calculate unit 74 that receives the VCO divide number N as a 16 bit input, and generates a 16 bit BIT ENABLE signal that is applied to the counter 70. The unit 74 calculates the LMO as a 4 bit number and applies it to a bit select unit 76. The count C of the counter 70 is also applied to the unit 76 as a 16 bit signal.

The bit select unit 76 comprises a CRMO calculate unit 78 that calculates the CRMO from the count C, and utilizes the LMO and CRMO to calculate the bit select value B as described above. The value B is applied to a remainder distributor unit 80 that generates the HOLD signals.

A pulse width counter 82 calculates the pulsewidth W of the UPDATE signal in VCO OUT periods. The counter 82 is initially reset by the RESET signal, and is triggered to start counting VCO OUT pulses by the leading edge of the UPDATE signal. The trailing edge of the UPDATE signal causes the counter 82 to stop counting. The count attained during this operation is the pulsewidth W of the UPDATE signal. The pulsewidth W is a 4 bit binary number, and is applied to a pulse distributor unit 84.

The unit 84 is also initially reset by the RESET signal, and receives the bit select value B from the unit 76 and the HOLD signal from the unit 80. The unit 84 generates and distributes the UPDATE PULSES as described with reference to FIG. 5 to the loop filter 66.

The bit select value B is used to generate and distribute both the HOLD signals for the VCO divider 70 and the UPDATE PULSES for the loop filter 66. As illustrated in TABLES 1 and 2, the HOLD signals are generated by selecting bits in the remainder R, whereas the UPDATE PULSES are generated by selecting bits in the pulsewidth W.

Referring to TABLE 1, only bits 0 to 3 are enabled in the counter 70, and the count C is reset to 0000 in response to the first VCO OUT pulse. The CRMO is 0, and the bit select value B=3. This designates bit 3 of the remainder 1011, which is high. In response to the logically high selected bit, the unit 80 produces a count value of 1, indicating that a HOLD signal is to be generated. A low HOLD signal is applied to the counter 70 that prevents the counter 70 from counting the second VCO OUT pulse.

This operation can be considered as a double state width, or a state width of 2, since the counter 70 only counts once in response to two VCO OUT signals. For each occurrence of a count value of 1, the counter 70 will count once in response to two VCO OUT pulses. It will be noted that there are 10 count value=1 and corresponding state width=2 occurrences in TABLE 1, thereby providing the required 10 HOLD signals for preventing the counter 70 from counting 10 VCO OUT pulses respectively.

The operation is essentially similar for the remaining VCO OUT pulses in TABLE 1. Each time the bit select value B selects a bit in the remainder R that is logically high, the counter 70 will operate in a double state mode in which it counts up by one count in response to two VCO OUT pulses. A DIVIDE OUT signal is produced in response to 26 VCO OUT pulses. This occurs when the count C reaches its maximum value of binary 1111 or decimal 16. The bit select value B is set to the most significant bit of the remainder R, and the count value C is forced to zero.

The UPDATE PULSES are generated and distributed by using the bit select value B to select bits in the pulsewidth W, which in this case is decimal 11=1011 binary. For example, the bit select value B for the first VCO OUT pulse is 3, and bit 3 of the pulsewidth W is logically high (1). This produces an update value of 1, and causes an UPDATE PULSE to be generated, having the same pulsewidth and period as the corresponding VCO OUT pulse. If the counter 70 is in a double state, the UPDATE PULSE will be generated during only the first VCO OUT period of the double state.

For the third VCO OUT pulse, the bit select value B=2. Since bit 2 of the pulsewidth W is logically low (0), an UPDATE PULSE will not be generated. It will be seen that each time the bit of the UPDATE PULSE WIDTH W which is selected is high, the update value will be 1 and an UPDATE PULSE will be generated. The update value is 1 for 11 VCO OUT pulses in TABLE 1, as required in accordance with the update pulse width W=11 decimal= 1011 binary.

Figure 8:
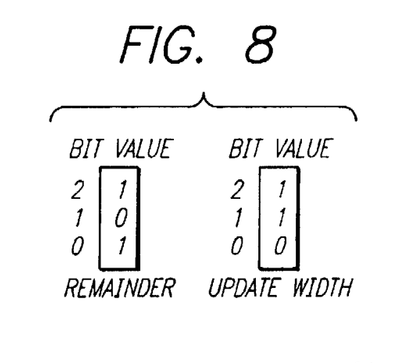
FIG. 8 is a diagram illustrating a bit select operation of the present PLL.
Figure 9:
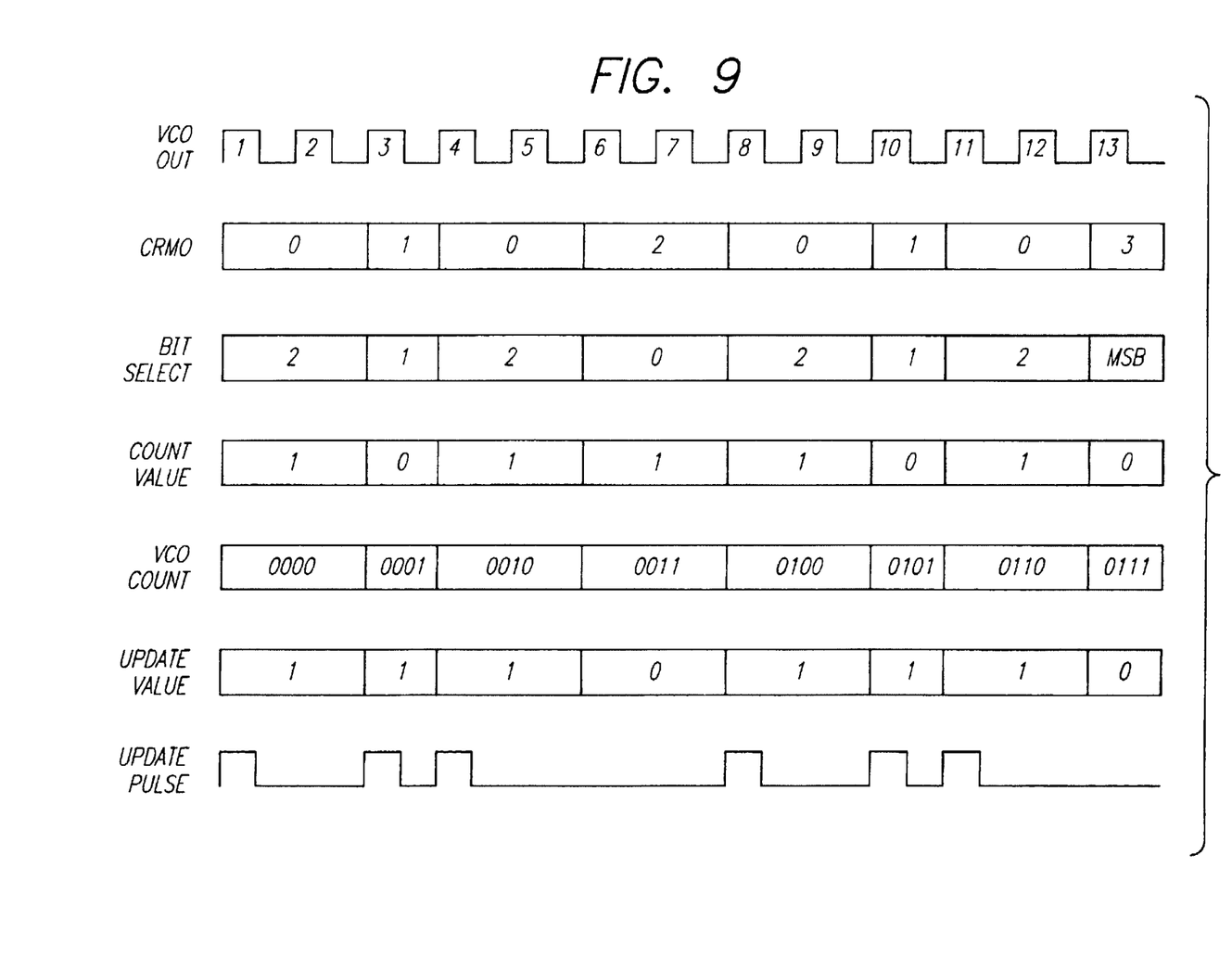
FIG. 9 is a timing diagram illustrating the bit select and operation in more detail.

A simplified example of the invention is presented in TABLE 3, and will be described with reference to FIGS. 8 and 9. In this case, the divide number N=13, and the update pulsewidth W=6.

TABLE 3

| VCO Pulse | Count (C) | CRMO | Select Bit (B) | Count Value | State Width | Update Value |
|---|---|---|---|---|---|---|
| 1 | 0000 | 0 | 2 | 1 | 2 | 1 |
| 2 | 0000 | | | | | 0 |
| 3 | 0001 | 1 | 1 | 0 | 1 | 1 |
| 4 | 0010 | 0 | 2 | 1 | 2 | 1 |
| 5 | 0010 | | | | | 0 |
| 6 | 0011 | 2 | 0 | 1 | 2 | 0 |
| 7 | 0011 | | | | | 0 |
| 8 | 0100 | 0 | 2 | 1 | 2 | 1 |
| 9 | 0100 | | | | | 0 |
| 10 | 0101 | 1 | 1 | 0 | 1 | 1 |
| 11 | 0110 | 0 | 2 | 1 | 2 | 1 |
| 12 | 0110 | | | | | 0 |
| 13 | 0111 | 3 | MSB | 0 forced | 1 | 0 |

The divide number N=13 has a binary value of 1101. The LMO=3, and has a value P=8. Thus, the remainder R=5 decimal=101 binary, and only bits 0 to 2 of the counter 70 are enabled. The counter 70 is controlled to count up to 8, and 5 HOLD signals are generated to prevent the counter 70 from counting 5 VCO OUT pulses (there are 5 double width states). The update width W=decimal 6=binary 110, and 6 UPDATE PULSES are generated. FIG. 8 illustrates the bit positions of the remainder R and the update width W, whereas FIG. 9 illustrates the time relationships of the major count values and signals.

The double width count states and the UPDATE PULSES are distributed within the period of each REF OUT pulse in a substantially uniform manner. Although the distribution is not perfectly even, it is sufficiently even for a large number of practical applications. Conventional synthesis would also have the drawback of lower frequency content in the signal sent to the filter.

One advantage of the present invention is that it can utilize a conventional binary counter and be implemented with considerably less circuitry than with the conventional method. For example, using current technology, the present circuit 60 can be implemented using 700 fewer gates than a conventional frequency synthesis design. The savings of the invention includes using an arbitrary divider as opposed to a conventional synthesizer.

Figure 10:
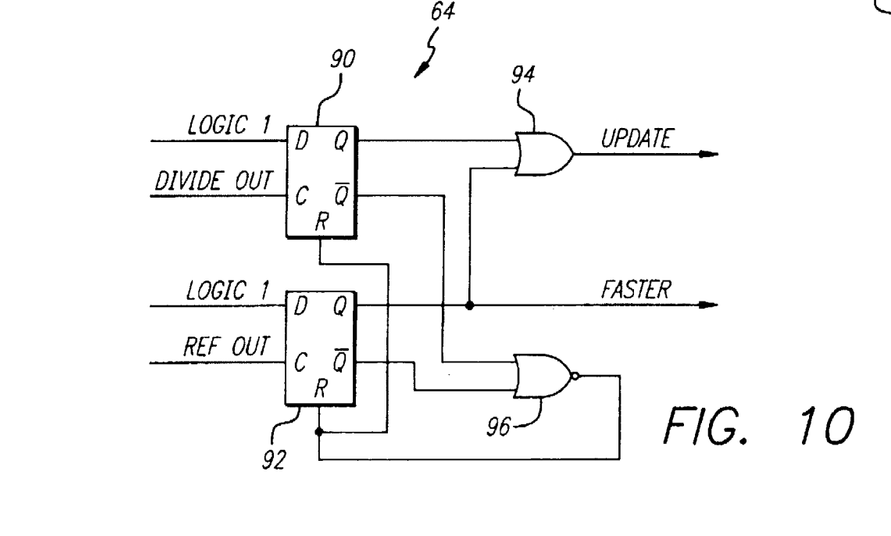
FIG. 10 is an electrical schematic diagram illustrating a phase detector of the present PLL.

The phase detector 64 is illustrated in FIG. 10, and comprises D-type flip-flops 90 and 92 that have clock inputs C connected to receive the DIVIDE OUT pulses and the REF OUT pulses respectively. The D inputs of the flip-flops 90 and 92 are hard wired logically high. The Q outputs of the flip-flops 90 and 92 are connected to inputs of an OR gate 94, whereas the inverted Q outputs thereof are connected to inputs of a NOR gate 96. The output of the NOR gate 96 is connected to reset inputs R of the flip-flops 90 and 92. The UPDATE signal is produced at the output of the OR gate 94, whereas the FASTER signal is produced at the Q output of the flip-flop 92.

The flip-flops 90 and 92 are initially in a reset state, with the Q outputs thereof being low and the inverted Q outputs thereof being high. The outputs of the NOR gate 94 (the ENABLE signal) and the NOR gate 96, as well as the FASTER signal, are low.

Assuming that the VCO OUT pulse frequency is too low, the leading edge of a REF OUT pulse will be generated prior to the leading edge of a corresponding DIVIDE OUT pulse. The leading edge of the REF OUT pulse will clock the flip-flop 92 such that the Q output thereof goes high. This is gated through the OR gate 94 to produce a high UPDATE signal. The FASTER signal also goes high.

The leading edge of the corresponding DIVIDE OUT pulse will clock the flip-flop 90 to produce a high Q output. Under this condition, the inverted Q outputs of both flip-flops 94 and 96 go low. This causes the output of the NOR gate 96 to go high and reset the flip-flops 90 and 92, and causes the UPDATE and FASTER signals to again go low.

In this manner, the UPDATE signal is produced during the time interval between the leading edges of the corresponding REF OUT and DIVIDE OUT pulses. The operation is reversed from that described above if the phase of the DIVIDE OUT pulse leads that of the REF OUT pulse and the leading edge of the DIVIDE OUT pulses clocks the flip-flop 90 before the leading edge of the REF OUT pulse triggers the flip-flop 92.

Figure 11:
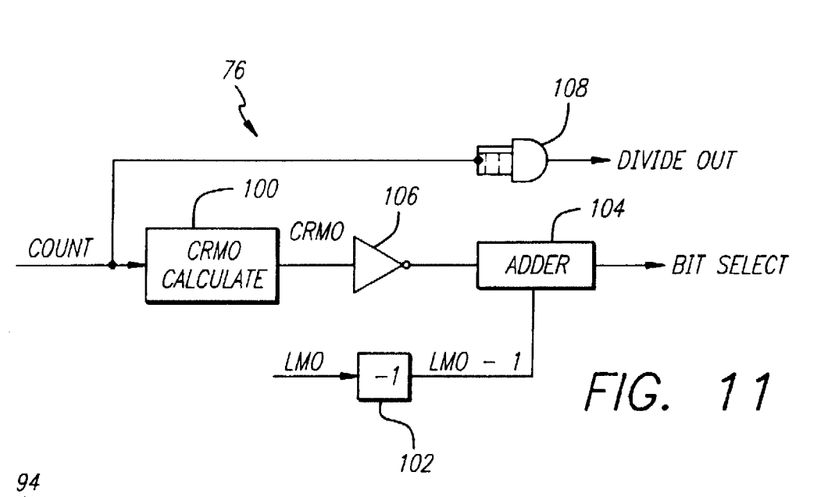
FIG. 11 is an electrical schematic diagram similarly illustrating a bit select unit of the PLL.

The bit select unit 76 is illustrated in FIG. 11, and comprises a CRMO calculate unit 100 that calculates the CRMO as described above. A subtractor 102 subtracts 1 from the LMO and applies the result to an adder 104. The CRMO is inverted by an inverter 106 and added to LMO-1 by the adder 104. The result is the bit select value B=LMO-1-CRMO.

The bit select unit 76 further comprises an AND gate 108 that has inputs connected to receive all of the bits of the count C from the counter 70. The output of the AND gate 108 goes high to produce the DIVIDE OUT signal when all bits of the count C go high as described above with reference to TABLE 1.

Figure 12:
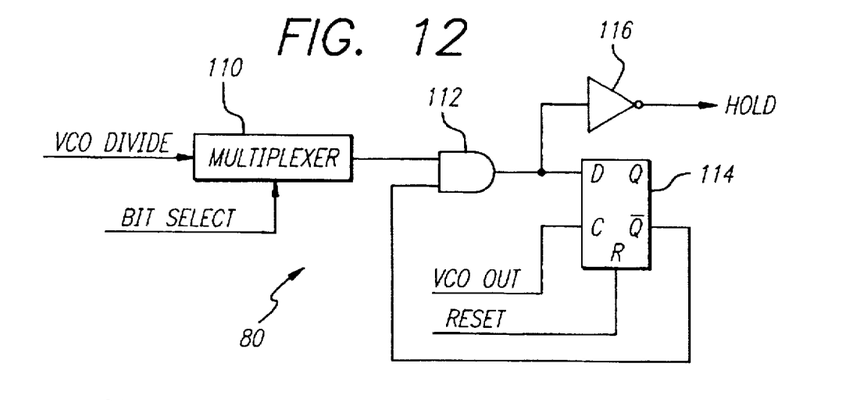
FIG. 12 is an electrical schematic diagram illustrating a remainder distributor unit.

The remainder distributor 80 is illustrated in FIG. 12, and comprises a 16 bit multiplexer 110 that receives the VCO divide number N at its data input and the bit select value B it its select input. The multiplexer 110 produces an output corresponding to the logical sense of the selected bit in the remainder R. Assuming that the selected bit is high, the output of the multiplexer 110 will be high, and vice-versa.

The output of the multiplexer 110 is applied to an input of an AND gate 112, the output of which is connected to the D input of a flip-flop 114. The inverted Q output of the flip-flop 114 is connected to another input of the AND gate 112. The VCO OUT pulses are applied to a clock input C of the flip-flop 114, whereas the RESET signal is applied to a reset input R thereof.

The AND gate 112 and flip-flop 114 control the generation of the double states in which the counter 70 counts up by one for each two consecutive VCO OUT pulses. The flip-flop 114 acts as a memory, and stores the state of the counter 70 for the previous VCO OUT pulse. The flip-flop 114 stores the state of the HOLD signal for the previous VCO OUT pulse, and in conjunction with the AND gate 112 ensures that only one R state is inserted per P state.

The output of the multiplexer 110 is high if the next state of the counter is to be or was one of the R extra states inserted. The inverted Q output of the flip-flop 114 is high if the last clock (VCO OUT) causes a new count value. That is, if the HOLD signal was high on the last clock and this high signal on the inverted Q output enables a high output from the multiplexer 110 to cause a high output from the AND gate 112 and a low HOLD signal which would insert one of the R extra counts. Conversely, a low inverted Q output would indicate that the HOLD signal had been low and the next clock and thus one of the R extra states had just been inserted.

Since only one extra R state is to be inserted in sequence, the low inverted Q output forces a how output from the AND gate 112 regardless of the output of the multiplexer 110 since it is still operating on data from an old count value which was used to insert the extra R state which has just occurred.

The output of the multiplexer 110 depends only on the current count and divide values and in no way on the previous count value or state of the counter. If the output of the multiplexer 110 is low, the present state will be a single state in that no extra R state will be inserted and the counter will be allowed to count.

More specifically, if the last state was a single state, the output of the multiplexer 110 will be low, the inverted Q output of the flip-flop 114 which is applied to the AND gate 112 will be high and the output of the AND gate 112 will be low. The output of the AND gate 112 is inverted by an inverter 116 to produce the HOLD signal as being high, causing the counter 70 to count VCO OUT pulses.

If the output of the multiplexer 110 is low (the next state is also a single state) in response to the next VCO OUT pulse, the AND gate 112 applies a low signal to the D input of the flip-flop 114, and the status of the flip-flip 114 remains the same. The HOLD signal remains high.

If the output of the multiplexer 110 is high (the next state is a double state) in response to the next VCO OUT pulse, the AND gate 112 applies a high signal to the D input of the flip-flop 114, and flip-flop 114 changes state. The high output of the AND gate 112 produces a low HOLD signal that prevents the counter 70 from counting on the next VCO OUT.

The inverted Q output of the flip-flop 114 goes low, and is applied to the AND gate 112. The AND gate 112 is inhibited by the low inverted Q output of the flip-flop 114, and will unconditionally produce a low output in response to the next VCO OUT pulse.

This low output is applied to the D input of the flip-flop 114, causing the flip-flop 114 to change state and causing the inverted Q output thereof to go high and enable the AND gate 112. Thus, the flip-flop 114 is rendered responsive to the output value of the multiplexer 110 in response to the next VCO OUT pulse.

Figure 13:
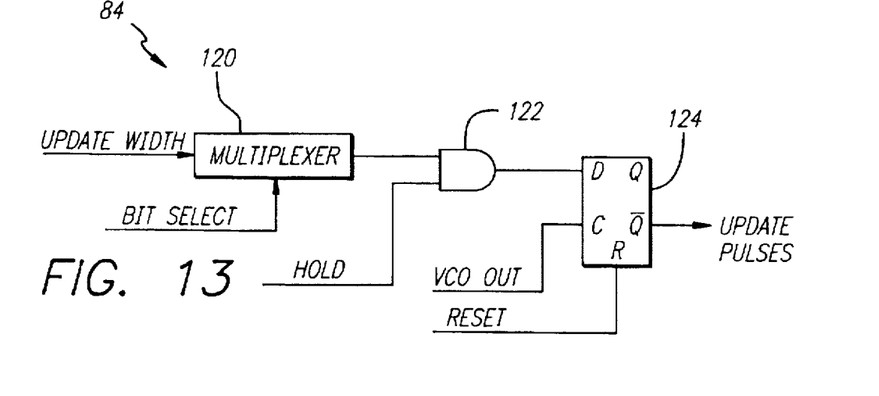
FIG. 13 is an electrical schematic diagram illustrating a pulse distributor unit.

The pulse distributor 84 is illustrated in FIG. 13, and comprises a multiplexer 120 that receives the update pulse-width W at its data input and the bit select value B at its select input. The output of the multiplexer 120 is applied to an input of an AND gate 122 which receives the HOLD signal at another input thereof.

The output of the AND gate 122 is applied to the D input of a flip-flop 124 that produces the UPDATE PULSES at its inverted Q output. The VCO OUT pulses are applied to the clock input C of the flip-flop 124, whereas the RESET signal is applied to the reset input R thereof.

The flip-flop 124 is clocked by the VCO OUT pulses and produces an output corresponding to the output of the multiplexer 120 in a manner similar to that described above with reference to FIG. 12. The AND gate 122 ensures that the flop-flop 124 is responsive only during valid VCO OUT cycles in which the HOLD signal is high which occurs P times during the period of the counter. The flip-flop 124 eliminates glitches and generates the UPDATE PULSES with clean waveforms.

Figure 14:
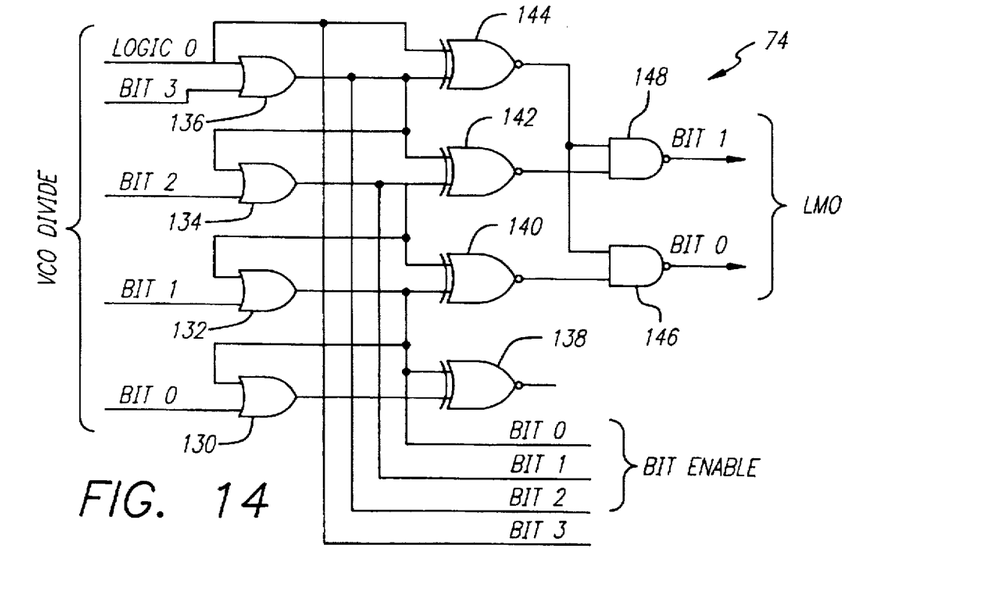
FIG. 14 is an electrical schematic diagram illustrating a leftmost one (LMO) calculate unit.

The LMO calculate unit 74 is illustrated in FIG. 14. Although the unit 74 is illustrated as comprising only four bit stages, this is merely to simplify the illustration and description of the invention. In the exemplary embodiment illustrated in FIGS. 6 and 7, the unit 74 actually comprises 16 bit stages. The remaining bit stages are connected and function in a manner that is essentially similar to that described below.

The four bit unit 74 as illustrated in FIG. 14 comprises OR gates 130, 132, 134 and 136 having inputs connected to receive bits 0 to 3 of the divide number N. The outputs of the OR gates 130, 132, 134 and 136 are connected to inputs of exclusive NOR gates 138, 140, 142 and 144 respectively.

The outputs of the OR gates 136, 134 and 132 are also connected to inputs of the OR gates 134, 132 and 130 and inputs of the exclusive NOR gates 142, 140 and 138 respectively. Inputs of the OR gate 136 and exclusive NOR gate 144 are hard wired logically low.

Bits 0 to 2 of the BIT ENABLE signal appear at the outputs of the OR gates 132, 134 and 136, whereas bit 3 of the BIT ENABLE signal is hard wired logically low. It will be noted that this wiring arrangement shifts the BIT ENABLE signal rightwardly by one binary bit, and performs the function of enabling only the bits in the counter 70 corresponding to the remainder R and enabling the counter to count to the power of two "P".

The outputs of the exclusive NOR gates 140 and 144 are connected to inputs of a NAND gate 146, whereas the outputs of the exclusive NOR gates 142 and 144 are connected to inputs of a NAND gate 148. Bits 0 and 1 of the LMO appear at the outputs of the NAND gates 146 and 148 respectively.

The OR gates 130, 132, 134 and 136 constitute a first stage of the LMO calculate unit 74 that produces a bit vector in which the LMO and all bits which are less significant than the LMO are high. The exclusive NOR gates 138, 140, 142 and 144 constitute a second stage that detects the transition between a high bit and an adjacent low bit in the bit vector, whereas the NAND gates 146 and 148 constitute an encoder that encodes the transition to produce the position of the LMO.

Assuming that the divide number N=0101 (LMO=2), the OR gate 134 will produce an output in response to the high value of bit 2. This high output is applied to an input of the OR gate 132 which produces a high output even though bit 1 of N is low. In this manner, the high value of the highest bit position cascades down through the OR gates 130, 132, 134 and 136 such that the outputs of all OR gates corresponding to the LMO and less significant bits produce high outputs.

Each of the exclusive NOR gates 138, 140, 142 and 144 has inputs connected to the outputs of OR gates 130, 132, 134 and 136 for two consecutive bits of the number N, and will produce a low signal if the two inputs are different. In the above example in which N=0101, the bit vector is 0111 and the transition is between bits 2 and 3.

The output of the exclusive NOR gate 142 will be low whereas the outputs of the other exclusive NOR gates will be high. The low output of the exclusive NOR gate 142 causes the NAND gate 148 to produce a high output, whereas the output of the NAND gate 146 is low. Thus, bits 0 and 1 of the LMO will be 0 and 1 respectively, producing the proper value of LMO=10 binary=decimal 2.

It will be noted that the outputs of the OR gate 130 and exclusive NOR gate 138 are not used, and these elements can be omitted. The gates 130 and 138 are included in the drawing merely to illustrate an implementation in which gates are typically provided in powers of 2 in practical integrated circuit chips, and unused gates are not connected. This is where the omitted signals would be fed in.

Figure 15:
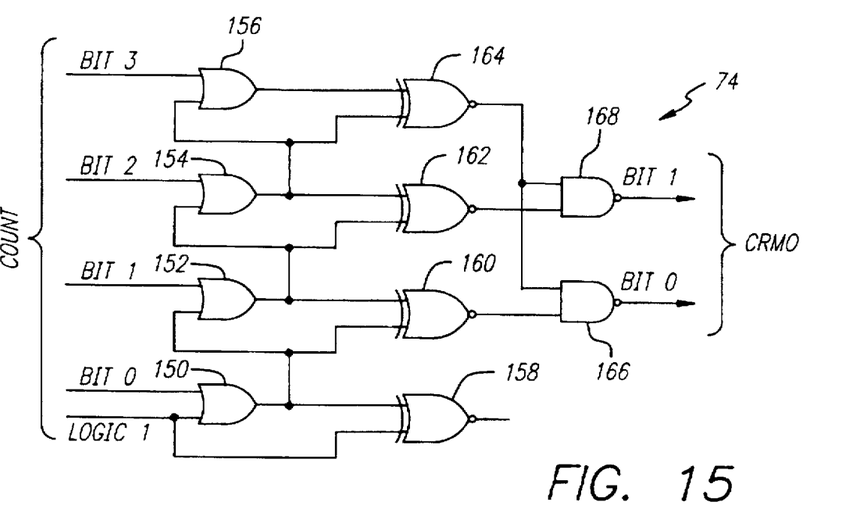
FIG. 15 is an electrical schematic diagram illustrating a contiguous rightmost ones (CRMO) unit.

The CRMO calculate unit 100 is illustrated in FIG. 15, also in simplified 4 bit form. As illustrated, the unit 100 comprises AND gates 150, 152, 154 and 156 having inputs connected to receive bits 0 to 3 of the count C. The outputs of the AND gates 150, 152, 154 and 156 are connected to inputs of exclusive NOR gates 158, 160, 162 and 164 respectively.

The outputs of the AND gates 150, 152 and 154 are also connected to inputs of the AND gates 152, 154 and 156 and inputs of the exclusive NOR gates 160, 162 and 164 respectively. Inputs of the AND gate 150 and exclusive NOR gate 158 are hard wired logically high.

The outputs of the exclusive NOR gates 160 and 164 are connected to inputs of a NAND gate 166, whereas the outputs of the exclusive NOR gates 162 and 164 are connected to inputs of a NAND gate 168. Bits 0 and 1 of the CRMO appear at the outputs of the NAND gates 166 and 168 respectively.

The AND gates 150, 152, 154 and 156 constitute a first stage of the CRMO calculate unit 100 that produces a bit vector in which the CRMO is high and all bits that are more significant than the CRMO are low.

The exclusive NOR gates 158, 160, 162 and 164 constitute a second stage that detects the transition between a high bit and an adjacent low bit in the bit vector, whereas the NAND gates 166 and 168 constitute an encoder that encodes the transition to produce the CRMO.

Assuming that the count C=1011 (CRMO=2), the AND gates 150 and 152 will produce high outputs and the AND gate 154 will produce a low output. The low output of the AND gate 154 is applied to an input of the AND gate 156 which produces a low output even though bit 3 of the count C is high.

In this manner, the low value of the bit that is next more significant than the most significant bit of the CRMO cascades up through the AND gates 150, 152, 154 and 156 such that the outputs of all AND gates corresponding to bit positions more significant than the CRMO are forced low.

Each of the exclusive NOR gates 158, 160, 162 and 144 has inputs connected to the outputs of AND gates 150, 152, 154 and 156 for two consecutive bits of the count C, and will produce a low signal if the two inputs are different. In the above example in which C=1011, the bit vector is 0011 and the transition is between bits 1 and 2.

The output of the exclusive NOR gate 162 will be low whereas the outputs of the other exclusive NOR gates will be high. The low output of the exclusive NOR gate 162 causes the NAND gate 168 to produce a high output, whereas the output of the NAND gate 166 will be low. Thus, bits 0 and 1 of the CRMO will be 0 and 1 respectively, producing the proper value of CRMO=10 binary=decimal 2.

It will be noted that the outputs of the AND gate 150 and exclusive NOR gate 158 are not used, and these elements can be omitted. In such a case, the inputs of the AND gate 152 and the exclusive NOR gate 160 that are illustrated as being connected to the output of the AND gate 150 are hard wired logically high.

While several illustrative embodiments of the invention have been shown and described, numerous variations and alternate embodiments will occur to those skilled in the art, without departing from the spirit and scope of the invention.

For example, the VCO divide counter 70 can be replaced by any other suitable type of binary up or down counter. The counter need not be provided with internal bit select and hold inputs, as these functions can be added externally using, for example, AND gates. For example, an AND gate can be provided that has an output connected to a clock input of the counter, with the HOLD signal and the VCO OUT pulses being applied to inputs of the AND gate, although not specifically illustrated.

Accordingly, it is intended that the present invention not be limited solely to the specifically described illustrative embodiments. Various modifications are contemplated and can be made without departing from the spirit and scope of the invention as defined by the appended claims.

I claim:

1. A variable frequency divider, comprising:

a binary counter for counting pulses; and a controller for controlling the counter to produce an output pulse after a number N of pulses has been applied to the counter such that said frequency of said pulses is divided by said number N, in which:

if said number N is not a power of 2, the controller controls the counter to count to a number P that is the largest power of 2 smaller than N; and the controller further prevents the counter from counting a number R=N-P of said pulses which are substantially evenly distributed among said number P of pulses that are counted by the counter.

2. A frequency divider as in claim 1, in which the controller comprises an LMO computer for computing a bit position LMO of a leftmost logically high bit in said number N and computing said number P as the value of said leftmost logically high bit.

3. A frequency divider as in claim 1, in which:

the counter comprises a plurality of binary bit stages that can be selectively enabled; and the controller comprises a bit enable computer for enabling a bit stage of the counter corresponding to a leftmost logically high bit in said number R and all bit stages of the counter that are less significant than said leftmost logically high bit.

4. A frequency divider as in claim 1, in which:

the counter comprises a hold input that prevents the counter from counting said pulses if a hold signal is applied to said hold input; and the controller applies R hold signals to said hold input of the counter to prevent the counter from counting R respective pulses.

5. A frequency divider as in claim 4, in which:

the counter produces a binary count C; and the controller comprises a hold signal distributor for producing and distributing said hold signals in accordance with said count C and said number R.

6. A frequency divider as in claim 5, in which the hold signal distributor comprises:

an LMO computer for computing a bit position LMO of a leftmost logically high bit in said number N;

a CRMO computer for computing a number CRMO of contiguous rightmost logically high bits in said count C that are less significant than said position LMO starting with a least significant bit in said count C:

a bit select computer for computing a bit select value B as B=LMO-1-CRMO;

a selector for selecting a bit S in said number R having a bit position corresponding to said value B; and a hold signal generator for producing a hold signal in response to a pulse if said bit S is logically high.

7. A frequency divider as in claim 6, in which:

the selector comprises a multiplexer having a data input for receiving said number N, a select input for receiving said value B and an output; and the hold signal generator produces a hold signal in response to a pulse if said output of the multiplexer has a logical sense corresponding to a logically high value of said bit S.

8. A frequency divider as in claim 6, in which the LMO computer comprises:

a first stage for producing a bit vector in which said position LMO and all bits that are less significant than said position LMO are logically high;

a second stage for computing a transition in said bit vector between a logically high bit and an adjacent logically low bit; and a third stage for encoding said transition to produce said position LMO.

9. A frequency divider as in claim 8, in which:

the first stage comprises a plurality of OR gates having first inputs connected to receive respective bits of said value N and second inputs connected to outputs of the OR gates for next less significant bits of said value N respectively;

the second stage comprises a plurality of exclusive NOR gates having first and second inputs connected to outputs of the OR gates for consecutive bits of said value N respectively; and the third stage comprises a plurality of NAND gates connected to outputs of the exclusive NOR gates in a manner that is predetermined to encode said outputs thereof.

10. A frequency divider as in claim 6, in which the CRMO computer comprises:

a first stage for producing a bit vector in which said contiguous rightmost logically high bits are logically high and all bits that are more significant than said contiguous rightmost logically high bits are logically low;

a second stage for computing a transition in said bit vector between a logically high bit and an adjacent logically low bit; and a third stage for encoding said transition to produce said number CRMO.

11. A frequency divider as in claim 10, in which:

the first stage comprises a plurality of AND gates having first inputs connected to receive respective bits of said count C and second inputs connected to outputs of the AND gates for next less significant bits of said count C respectively;

the second stage comprises a plurality of exclusive NOR gates having first and second inputs connected to outputs of the OR gates for consecutive bits of said count C respectively; and the third stage comprises a plurality of NAND gates connected to outputs of the exclusive NOR gates in a manner that is predetermined to encode said outputs thereof.

* * * * *